United States Patent [19]

Takizawa et al.

[11] Patent Number: 5,734,195
[45] Date of Patent: Mar. 31, 1998

[54] SEMICONDUCTOR WAFER FOR EPITAXIALLY GROWN DEVICES HAVING A SUB-SURFACE GETTER REGION

[75] Inventors: Ritsuo Takizawa; Takahisa Kusaka, both of Tokyo; Takayoshi Higuchi, Kanagawa; Hideo Kanbe, Kanagawa; Masanori Ohashi, Kanagawa, all of Japan

[73] Assignee: Sony Corporation, Tokyo, Japan

[21] Appl. No.: 636,887

[22] Filed: Apr. 24, 1996

Related U.S. Application Data

[60] Continuation of Ser. No. 465,750, Jun. 6, 1995, abandoned, which is a division of Ser. No. 216,052, Mar. 21, 1994, abandoned.

[30] Foreign Application Priority Data

Mar. 30, 1993 [JP] Japan ................................. 5-095388
Jan. 25, 1994 [JP] Japan ................................. 6-023145

[51] Int. Cl.⁶ ........................ H01L 29/04; H01L 21/265; H01L 21/306
[52] U.S. Cl. .................. 257/607; 257/913; 257/227; 257/618; 257/291; 437/95; 437/11
[58] Field of Search .................. 257/607, 612, 257/614, 618, 617, 913, 227, 240, 291; 437/95, 10, 11

[56] References Cited

U.S. PATENT DOCUMENTS

| | | | |
|---|---|---|---|
| 4,053,335 | 10/1977 | Hu | 257/928 |
| 4,490,216 | 12/1984 | McConnell | 257/253 |
| 4,579,601 | 4/1986 | Samata et al. | 29/571 |
| 4,766,086 | 8/1988 | Ohshima et al. | 257/617 |
| 4,885,257 | 12/1989 | Matsushita | 437/24 |
| 4,914,046 | 4/1990 | Tobin et al. | 437/24 |
| 5,098,852 | 3/1992 | Niki et al. | 437/11 |
| 5,130,260 | 7/1992 | Suga et al. | 437/11 |
| 5,130,261 | 7/1992 | Usuki et al. | 437/230 |
| 5,143,858 | 9/1992 | Tomozane et al. | 437/24 |
| 5,194,395 | 3/1993 | Wada | 437/10 |
| 5,223,734 | 6/1993 | Lowrey et al. | 257/401 |
| 5,250,445 | 10/1993 | Bean et al. | 437/11 |
| 5,289,031 | 2/1994 | Watanabe et al. | 257/617 |
| 5,405,803 | 4/1995 | Kusaka | 437/95 |
| 5,453,385 | 9/1995 | Shinji | 437/11 |
| 5,514,885 | 5/1996 | Myrick | 257/216 |

FOREIGN PATENT DOCUMENTS

| | | | |
|---|---|---|---|
| 59-54220 | 3/1984 | Japan | . |
| 0067624 | 4/1984 | Japan | 437/11 |
| 0314757 | 4/1986 | Japan | 437/11 |
| 0206932 | 7/1992 | Japan | 437/11 |
| 0152304 | 6/1993 | Japan | 437/11 |

*Primary Examiner*—Tom Thomas
*Assistant Examiner*—Alexander Oscar Williams
*Attorney, Agent, or Firm*—Ronald P. Kananen

[57] ABSTRACT

In a semiconductor wafer according to this invention, an epitaxial layer is formed on the surface of a semiconductor substrate, a second element which is not the same but homologous as a first element constituting the semiconductor substrate is present to have a peak concentration on the semiconductor substrate side rather than the surface, and this peak concentration is $1 \times 10^{16}$ atoms/cm$^3$ or more.

17 Claims, 4 Drawing Sheets

5,734,195

SEMICONDUCTOR WAFER FOR EPITAXIALLY GROWN DEVICES HAVING A SUB-SURFACE GETTER REGION

This application is a continuation of application Ser. No. 08/465,750 filed Jun. 6, 1995, now abandoned, which is a divisional application of Ser. No. 08/216,052 filed Mar. 21, 1994, now abandoned.

BACKGROUND OF THE INVENTION

1. Field of the Invention

The present invention relates to a semiconductor wafer for forming a semiconductor device and, more particularly, a solid stage imaging device and a method of manufacturing the semiconductor wafer.

2. Description of the Prior Art

As a semiconductor wafer for forming a semiconductor device, a CZ substrate grown by a CZ method, an MCZ substrate grown by an MCZ method, an epitaxial wafer obtained by forming an epitaxial layer on the surface of the CZ or MCZ substrate, or the like has been conventionally used.

On the other hand, although the step of forming a semiconductor device is performed in an ultra clean room of class 100 or less, the semiconductor substrate cannot be completely prevented from being contaminated by impurities from gases, water, and apparatus for manufacturing a semiconductor device and the like. In addition, the dose of impurity implanted into the semiconductor wafer in the step of forming an epitaxial layer on the surface of the semiconductor substrate is larger than the dose of impurity implanted into the semiconductor wafer in the step of forming a semiconductor device.

When an impurity or crystal defects are present in the active region of the semiconductor wafer, the quality and characteristics of the semiconductor device are considerably degraded. In addition, when the impurity and crystal defects are present in the semiconductor wafer, the semiconductor wafer is easily damaged by radiation such as α rays, and the quality and characteristics of the semiconductor device are further degraded by this damage.

In order to remove the impurity and crystal defects from the active region, intrinsic gettering (IG) or extrinsic gettering (EG) has been conventionally performed. FIGS. 1 and 2 show the characteristics of a semiconductor device formed on an epitaxial wafer subjected to these processes described above.

In order to obtain the results shown in FIGS. 1 and 2, epitaxial layers were simultaneously formed on a CZ substrate which was not subjected to gettering, a CZ substrate which was subjected to EG and a CZ substrate which was subjected to IG, respectively. In this case, the EG was performed such that a polysilicon film having a thickness of 1.5 μm was formed on the lower surface of the CZ substrate by a CVD method at a temperature of 620° C. The IG was performed such that oxygen was precipitated by sequentially performing annealing at 1,100° C. for 1.5 hours, annealing at 650° C. for 10 hours and annealing at 1,050° C. for 2 hours for the CZ substrate to form crystal defects inside the CZ substrate.

A MOS capacitor having a gate electrode consisting of an Al film and a gate insulating film consisting of an $SiO_2$ film having a thickness of 20 nm and a CCD imaging device were formed on each of these epitaxial wafers. FIG. 1 shows a generation life time which is obtained by a C-t method using the MOS capacitor and represented as a value normalized such that a measurement value of a CZ substrate is set to be 1. FIG. 2 shows the number of white defects of each CCD imaging device represented as a value normalized such that a measurement value of an MCZ substrate is set to be 1. Note that these white defects are equivalent to dark currents caused by impurities or the like.

However, as is apparent from FIGS. 1 and 2, even when the EG or IG is performed for an epitaxial wafer, the generation life time of the epitaxial wafer is almost equal to that of a CZ substrate. The number of white defects of the epitaxial wafer cannot be reduced to that of an MCZ substrate. On the other hand, in the CZ or MCZ substrate, defects are present in not only the substrate but also the gate insulating film formed on the surface of the substrate, and current leakage caused by a decrease in breakdown voltage of the gate insulating film or an increase in interface state causes a transfer failure or the like in the CCD imaging device.

SUMMARY OF THE INVENTION

In a semiconductor wafer according to the present invention, a second element present in a semiconductor substrate at a peak concentration of $1\times10^{16}$ atoms/cm$^3$ or more accelerates oxygen precipitation to form crystal defects at a high density in the semiconductor substrate, and the crystal defects serve as a gettering site. In addition, since the covalent bonding radius of a first element constituting the semiconductor substrate is different from that of the second element present in the semiconductor substrate, stress is generated, and this stress itself serves as a gettering site.

For this reason, impurities and crystal defects which are originally present in the semiconductor substrate or impurities and crystal defects which are respectively implanted and formed in the semiconductor substrate when the epitaxial layer is formed and then when a semiconductor device such as a solid state imaging device is formed are strongly gettered, and a gettering capability is kept for a long time.

In addition, since the second element has a peak concentration on the semiconductor substrate side rather than the surface of the semiconductor substrate, the crystallinity of the surface is rarely degraded, and the crystallinity of an epitaxial layer formed on the surface is rarely degraded. Therefore, a semiconductor device which is excellent in quality and characteristics, and more particularly, a solid state imaging device having a small number of white defects can be formed.

In a method of manufacturing a semiconductor wafer according to the present invention, since an epitaxial layer is formed on the surface of a semiconductor substrate including a getter region, there can be provided a semiconductor wafer capable of strongly gettering an impurity and crystal defects which are originally present in a semiconductor substrate or an impurity and crystal defects which are respectively implanted and formed in the step of forming an epitaxial layer and then in the step of forming a semiconductor device, and keeping a gettering capability for a long time. Therefore, the semiconductor wafer on which a semiconductor device which is excellent in quality and characteristics can be formed can be manufactured.

In another method of manufacturing a semiconductor wafer according to the present invention, a second element ion-implanted into a semiconductor substrate accelerates oxygen precipitation to form crystal defects at a high density in the semiconductor substrate, and these crystal defects serve as a gettering site. In addition, since the covalent bonding radius of the first element constituting the semiconductor substrate is different from that of the second element ion-implanted into the semiconductor substrate, stress is generated, and this stress itself serves as a gettering site.

For this reason, there can be provided a semiconductor wafer capable of strongly gettering an impurity and crystal defects which are originally present in a semiconductor substrate or an impurity and crystal defects which are respectively implanted and formed in the step of forming an epitaxial layer and then in the step of forming a semiconductor device, and keeping a gettering capability for a long time. Therefore, the semiconductor wafer on which a semiconductor device which is excellent in quality and characteristics can be formed can be manufactured.

In still another method of manufacturing a semiconductor wafer according to the present invention, since the dose of a second element is $5 \times 10^{13}$ ions/cm$^2$ or more, formation of high-density crystal defects and stress generation performed by ion-implanting the second element can be satisfactorily performed, and a semiconductor wafer having a high gettering capability can be manufactured. In addition, since the dose of the second element is $5 \times 10^{15}$ ions/cm$^2$ or less, the crystallinity of the surface of the semiconductor substrate is rarely degraded, and the crystallinity of an epitaxial layer formed on the surface is rarely degraded. Therefore, a semiconductor wafer on which a semiconductor device which is excellent in quality and characteristics can be formed can be manufactured.

In still another method of manufacturing a semiconductor wafer according to the present invention, since the cooling step or the like for increasing a gettering effect is performed when an epitaxial layer is formed, a semiconductor wafer having a gettering capability higher than that of a semiconductor wafer in which a second element is only ion-implanted can be manufactured. Therefore, a semiconductor wafer on which a semiconductor device which is excellent in quality and characteristics can be formed can be manufactured.

In still another method of manufacturing a semiconductor wafer according to the present invention, oxygen precipitation is more accelerated when a second element is ion-implanted into a semiconductor substrate so that crystal defects can be formed at a high density. For this reason, a semiconductor wafer having a higher gettering capability can be manufactured. Therefore, a semiconductor wafer on which a semiconductor device which is excellent in quality and characteristics, more particularly, a solid state imaging device having a small number of white defects, can be formed.

In still another method of manufacturing a semiconductor wafer according to the present invention, there can be provided a semiconductor substrate in which the number of point defects and the number of clusters of the point defects formed during crystal growth are originally small, and, even when an impurity and crystal defects are present, the impurity and the crystal defects can be strongly gettered by precipitated oxygen. Therefore, a semiconductor wafer on which a semiconductor device which is excellent in quality and characteristics, more particularly, a solid state imaging device having a small number of white damage defects, can be formed can be manufactured.

DETAILED DESCRIPTION OF THE PREFERRED EMBODIMENTS

Figure 1:
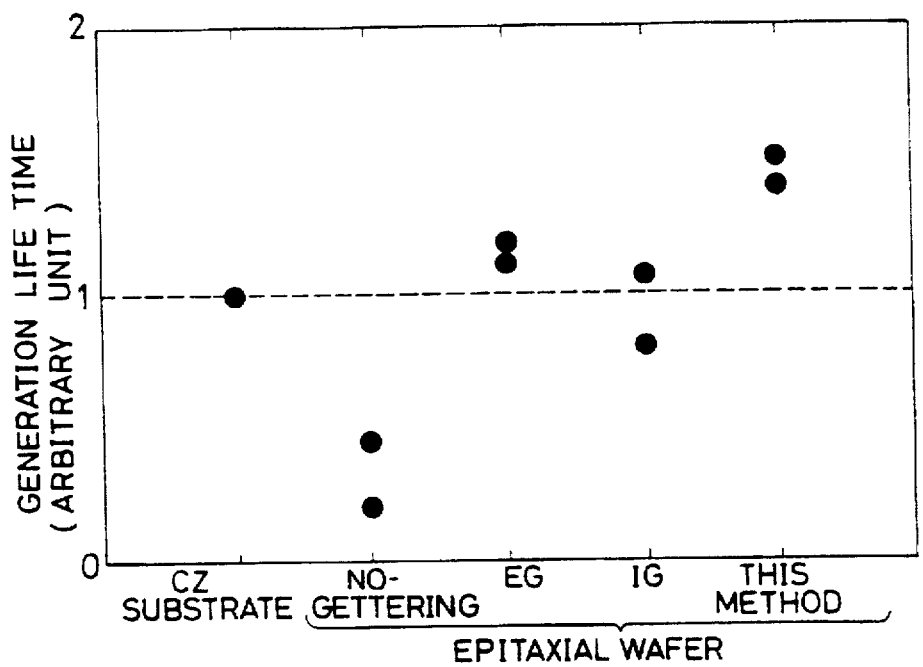
FIG. 1 is a graph showing the relationship between the type of a semiconductor substrate and a generation life time.

The first and second embodiments of the present invention will be described below with reference to FIGS. 1 to 6. FIGS. 3A to 3C show the first embodiment. According to the first embodiment, as shown in FIG. 3A, a CZ substrate 11 which is an Si substrate grown by a CZ method is provided. In this CZ substrate 11, the surface is set to be a mirror surface 12, a resistivity is set to be 1 to 10 Ω·cm, and an oxygen concentration is set to be $1.5 \times 10^{18}$ atoms/cm$^3$. This CZ substrate 11 is washed with an aqueous NH$_4$OH/H$_2$O$_2$ solution and then washed with an aqueous HCl/H$_2$O$_2$ solution.

The CZ substrate 11 is dry-oxidized at a temperature of 1,000° C., and, as shown in FIG. 3B, an SiO$_2$ film 13 having a thickness of about 20 nm is formed on the mirror surface 12. Carbon 14 is ion-implanted from the mirror surface 12 into the CZ substrate 11 through the SiO$_2$ film 13 at an acceleration energy of 800 keV and a dose of $1 \times 10^{14}$ ions/cm$^2$. At this time the projected range of the carbon 14 is about 1.3 µm, and the peak concentration of the carbon 14 is about $1 \times 10^{18}$ atoms/cm$^3$.

The resultant structure is annealed in an N$_2$ atmosphere at 1,000° C. for 10 minutes. As a result, as shown in FIG. 3C, carbon-implanted region 15 having a peak concentration at a position deeper than the mirror surface 12 of the CZ substrate 11 is formed. The peak concentration of the carbon 14 in the carbon implanted region 15 is set to be $1 \times 10^{16}$ atoms/cm$^3$ or more.

Thereafter, the SiO$_2$ film 13 is removed by an aqueous HF/NH$_4$F solution. An Si epitaxial layer 16 having a resistivity of about 20 to 30 Ω·cm and a thickness of about 10 µm is grown on the mirror surface 12 at a temperature of about 1,150° C. using SiHCl$_3$ gas, thereby completing an epitaxial wafer 17.

The position of the peak concentration of the carbon 14 in the carbon implanted region 15 is located at a position deeper than the mirror surface 12 because of the following reason. That is, when the position of the peak concentration is located on the mirror surface 12, the crystallinity of the mirror surface 12 is degraded, and the crystallinity of the Si epitaxial layer 16 grown on mirror surface 12 is degraded. In addition, ling is performed in an N$_2$ atmosphere after the ion implantation is performed because of the following reason. That is, since the Si epitaxial layer 16 is grown on the mirror surface 12 later, the crystallinity of the CZ substrate 11 near the mirror surface 12 converted into an amorphous state by the ion implantation is restored.

In addition, the SiO$_2$ film 13 is formed on the mirror surface 2 because of the following reason. That is, when carbon 14 is ion-implanted, channeling is prevented, and the surface 12 is prevented from being sputtered. $SiO_2$ film 13 and annealing in an $N_2$ atmosphere are not necessarily required depending on an acceleration or dose at which the carbon 14 is ion-implanted.

Figure 2:
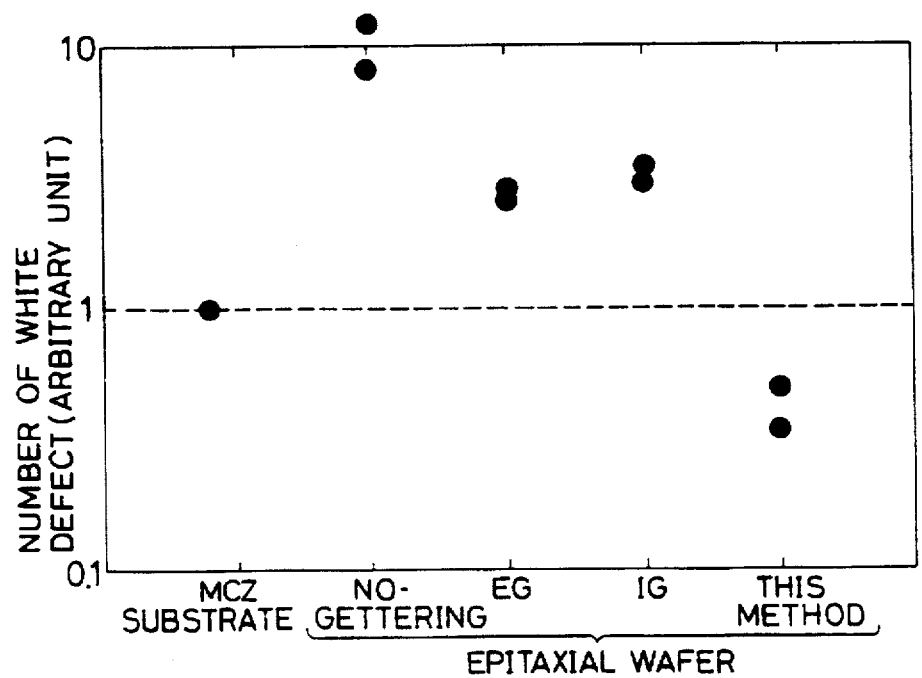
FIG. 2 is a graph showing the relationship between the type of the semiconductor substrate and the number of white defects.
Figure 3A:
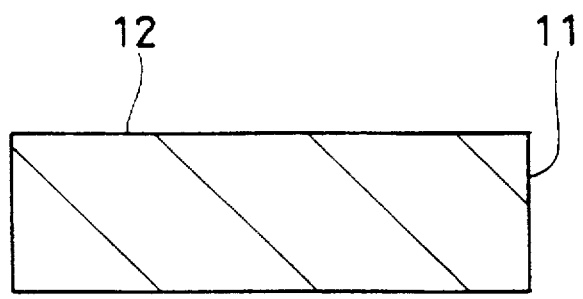
FIGS. 3A to 3C are views sequentially showing the steps in manufacturing a semiconductor wafer according to the first embodiment of the present invention.
Figure 3B:
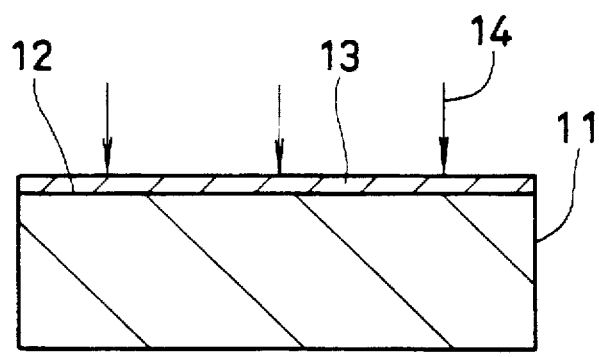
Figure 3C:
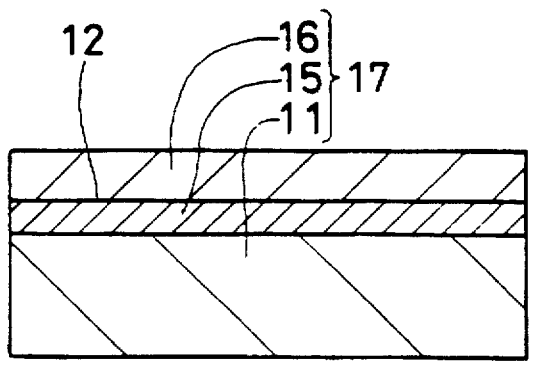

FIGS. 1 and 2 show also values measured by using the epitaxial wafer 17 of the first embodiment. The CZ substrate for forming a conventional epitaxial wafer shown in FIGS. 1 and 2 and the CZ substrate 11 for forming the epitaxial wafer 17 of the first embodiment have the same specifications. As is apparent from FIGS. 1 and 2, the generation life time of the CZ substrate 11 of this embodiment is about 1.4 times that of the conventional CZ substrate, the number of white defects of the CZ substrate 11 is about ½ that of the conventional CZ substrate. That is, in the epitaxial wafer 17 even when a semiconductor device is formed, a gettering capability effectively functions.

Figure 4:
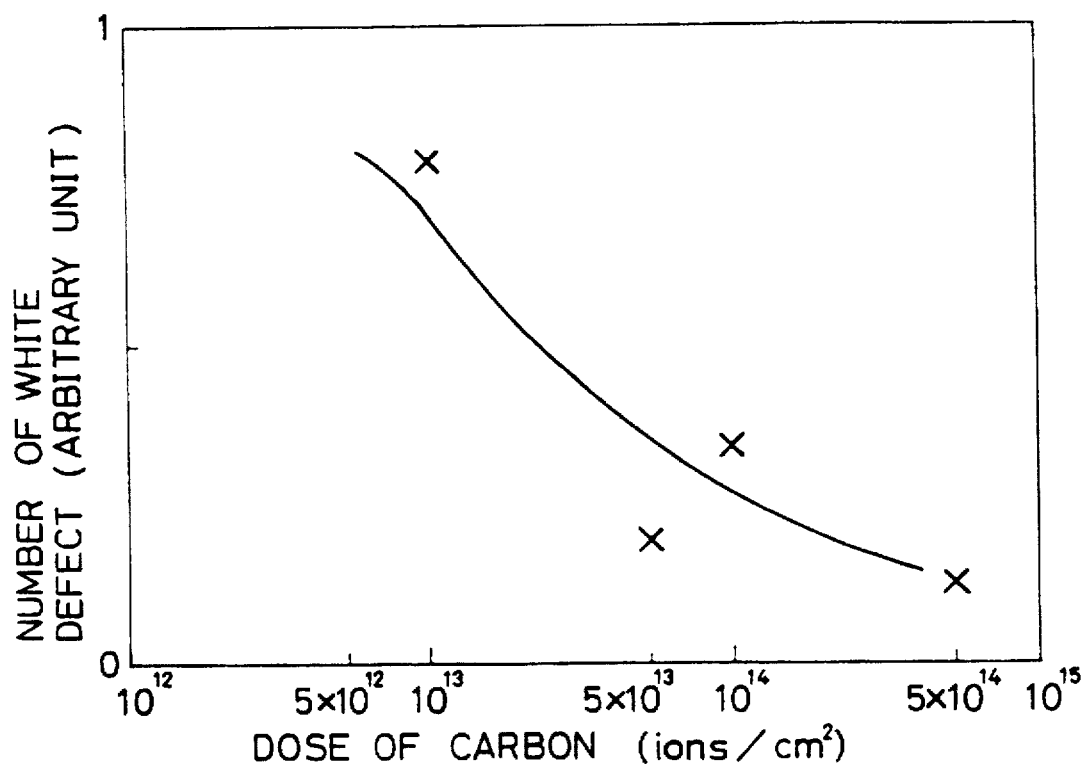
FIG. 4 is a graph showing the relationship between the dose of carbon and the number of white defects.

Note that, in the first embodiment, although the carbon 14 is ion-implanted into the CZ substrate 11 at an acceleration energy of 800 keV and a dose of $1\times10^{14}$ ions/cm$^2$, the relationship between the dose of the carbon 14 and the number of white defects of a CCD imaging device formed on the epitaxial wafer 17, obtained when only the dose of the above conditions is variously changed, is shown in FIG. 4.

FIG. 4, as in FIG. 2, shows a value normalized such that the number of white damage defects of a CCD imaging device formed on the MCZ substrate is set to be 1. Although FIG. 2 is a logarithmic graph, FIG. 4 is a linear graph. As is apparent from FIG. 4, although the number of white defects of the CCD imaging device becomes smaller than that of the CCD imaging device on the MCZ substrate when the carbon 14 is only ion-implanted, when the dose is set to be $5\times10^{13}$ ions/cm$^2$ or more, the number of white defects is particularly small, and a large gettering effect can be obtained by ion implantation of the carbon 14.

However when the dose exceeds $5\times10^{15}$ ions/cm$^2$, the crystallinity of the mirror surface 12 of the CZ substrate 11 is degraded, and the crystallinity of the Si epitaxial layer 16 grown on the mirror surface 12 is degraded. Therefore, the dose of the carbon 14 preferably falls within a range of $5\times10^{13}$ to $5\times10^{15}$ ions/cm$^2$.

In the first embodiment described above, although the carbon 14 is ion-implanted at an acceleration energy of 800 keV, even when this acceleration energy is set to be 400 keV, a gettering effect equal to that obtained by the acceleration energy of 800 keV may be obtained by ion implantation of the carbon 14; even when the acceleration energy is set to be 200 keV, a gettering effect equal to that obtained at the acceleration energy of 800 keV may be obtained by ion implantation of the carbon 14.

Therefore, when the carbon 14 is ion-implanted at a low acceleration energy, a generally used high-current ion implantation equipment can be used, and $C^+$ capable of obtaining a current ten times a current obtained b $C^{2+}$ can be used. For this reason, the throughput of he semiconductor wafer implanted by 200 keV can be about 10 times that of the semiconductor wafer implanted by 800 keV.

When the acceleration energies are set to be 400 keV and 200 keV, the projected range of the carbon 14 are about 0.75 μm and about 0.40 μm, respectively. In either case, as in the case wherein the acceleration energy is set to b 800 keV, the carbon-implanted region 15 having a peak concentration at a position deeper than the mirror surface 12 of the CZ substrate 11 can be formed.

In the first embodiment, although the Si epitaxial layer 16 is grown on the mirror surface 12 of the CZ substrate if at a time, the steps of growing the Si epitaxial layer 16 at an epitaxial growth temperature to have a predetermined thickness and temporarily cooling the CZ substrate 11 to the temperature which is ½ the epitaxial growth temperature or less may be repeated two or more times, thereby forming the Si epitaxial layer 16 having a desired thickness.

In this manner, since the CZ substrate 11 receives the heat hysteresis two or more times when the Si epitaxial layer 16 is formed, crystal defects formed in the CZ substrate 11 by ion implantation of the carbon 14 are more grown, and the gettering capability of the epitaxial wafer 17 is more improved.

In the first embodiment, although only ion implantation of the carbon 14 is performed to improve the gettering capability of the epitaxial wafer 17, when EG performed by forming a polysilicon film or a phospho-silicate glass film on the lower surface of the CZ substrate 11, the gettering capability can be more improved.

In the first embodiment, although only the carbon 14 is ion-implanted into the CZ substrate 11 which is an Si substrate, Ge, Sn, Pb or the like which is a Group IV element may be ion-implanted into the CZ substrate 11 in place of the carbon 14, and an element other than a Group IV element may be ion-implanted into the CZ substrate 11 together with the Group IV element such as the carbon 14. In addition, according to the first embodiment, although the CZ substrate 11 which is an Si substrate is used, an MCZ substrate may be used as the Si substrate and a substrate other than an Si substrate may be used. When the substrate other than the Si substrate, a least an element which is not the same but homologous as the element constituting this substrate and electrically neutral is ion-implanted into the substrate.

In the first embodiment, although the Si epitaxial layer 16 grown using $SiHCl_3$, $SiCl_4$, $SiH_2Cl_2$, $SiH_3Cl$ or $SiH_4$ may be used in place of $SiHCl_3$. In particular, it known that the characteristics of the semiconductor are more improved using $SiH_4$.

The embodiment will be described below. According the second embodiment, an Si crystal growth rate obtained by an MCZ method was set to be 0.5 mm/min, and an Si wafer having an oxygen concentration of $1\times10^{18}$ atoms/cm$^3$, the surface as a mirror surface and a resistivity of about 20 Ω·cm was formed. A MOS capacitor having a gate electrode consisting of an Al film and a gate insulating film consisting of an $SiO_2$ film having a thickness of 20 nm and a CCD imaging device were formed on the Si wafer.

When the Si wafer manufactured according to the second embodiment is compared with an Si wafer manufactured according to the prior art, the yield of $SiO_2$ breakdown strength of the MOS capacitor according to the second embodiment is increased to about 4 times that of the MOS capacitor according to the prior art, and the number of white defects of the CCD imaging device according to the second embodiment is reduced to ⅕ or less that of the CCD imaging device according to the prior art. Note that, although the Si crystal is grown by the MCZ method in the second embodiment, when the Si crystal is grown by a CZ method, the same effect as described above can be expected.

Figure 5:
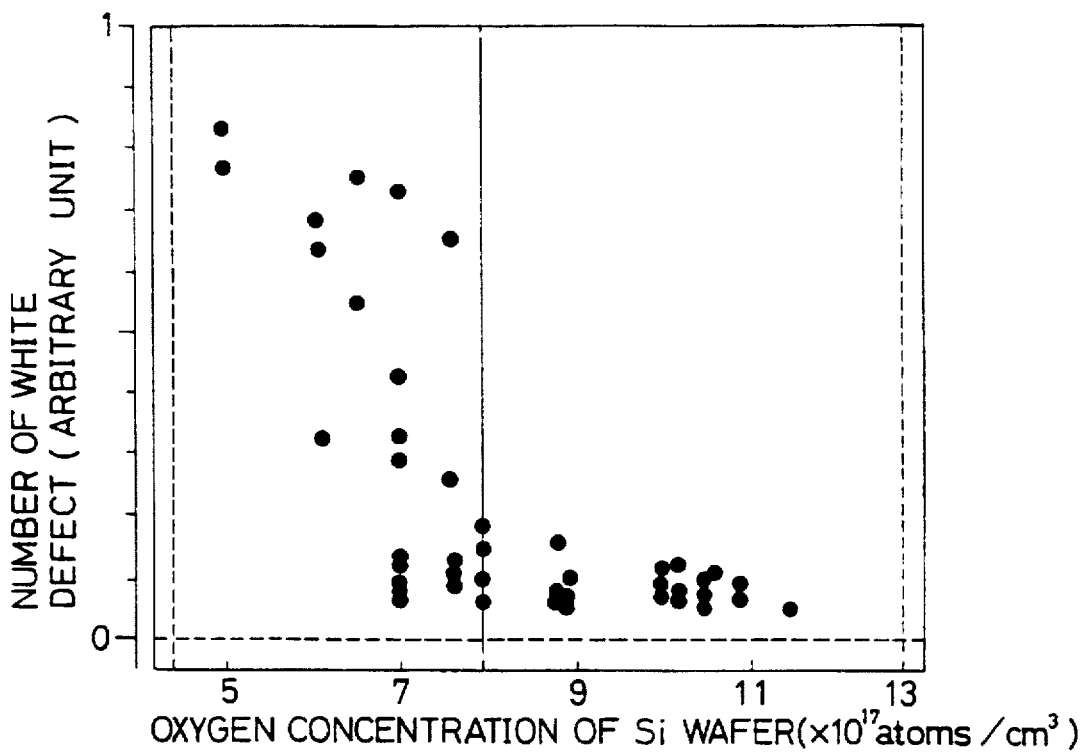
FIG. 5 is a graph showing the relationship between the oxygen concentration of an Si wafer and the number of white defects.

FIG. 5 shows the relationship between the oxygen concentration of the Si wafer and the number of white defects of the CCD imaging device formed on the Si wafer, obtained when the oxygen concentration of the Si wafer is variously changed. As is apparent from FIG. 5, the number of white defects is stably kept small when the oxygen concentration is set to be $8\times10^{17}$ atoms/cm$^3$ or more. This may occur because an impurity or crystal defects are gettered by an IG effect naturally caused in the step of forming the CCD imaging device.

Figure 6:
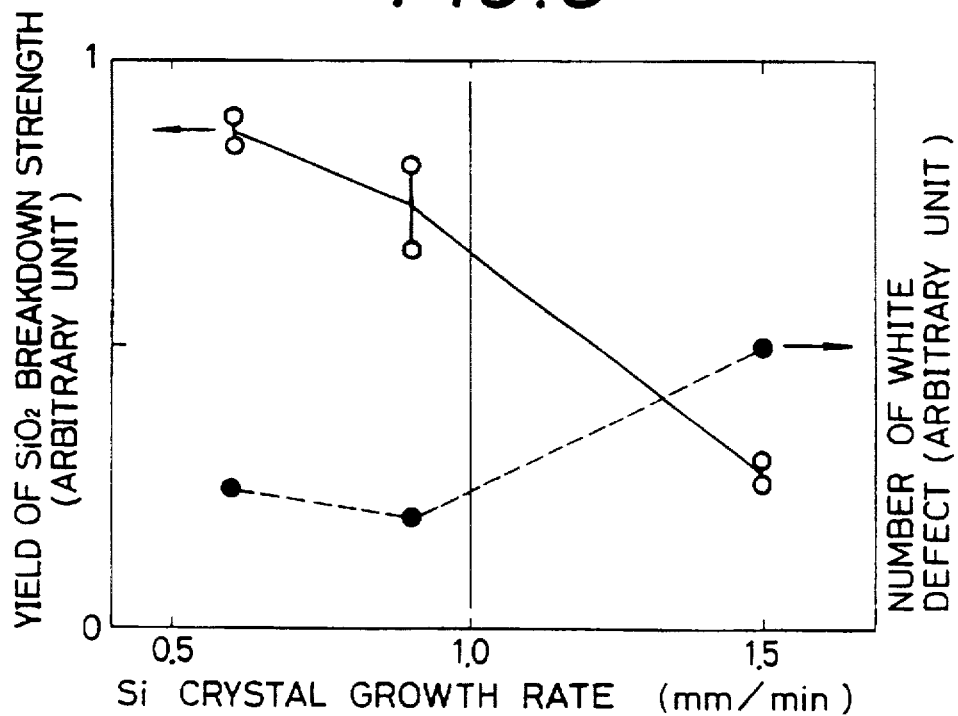
FIG. 6 is a graph showing the relationship between an Si crystal growth rate, the yield of SiO$_2$ breakdown strength and the number of white defects.

FIG. 6 shows the relationship between the Si crystal growth rate, the yield of $SiO_2$ breakdown strength of the MOS capacitor formed on the Si wafer and the number of white defects of the CCD imaging device, obtained when the Si crystal growth rate is variously changed the oxygen concentration of the Si wafer is fixed $9\times10^{17}$ atoms/cm$^3$. As is apparent from FIG. 6, when the growth rate is 1 mm/min or less, the yield of $SiO_2$ breakdown strength of the $SiO_2$ film and the number of white defects have preferable values. This may occur because the number of point defects and the number of clusters of the point defects formed in growing the crystal are small due to a low growth rate.

Therefore, when a CCD imaging device is formed on the Si wafer described above, not only the number of white defects is small, a transfer failure or the like caused by a decrease in breakdown voltage of the gate insulating film rarely occurs. Note that about 1.5 mm/min has been conventionally employed as the Si crystal growth speed in consideration of productivity.

What is claimed is:

1. In combination, a solid state imaging device and a semiconductor wafer, including:

a semiconductor wafer comprising:

a semiconductor substrate comprised of silicon and having a surface on which electronic devices will be formed, said substrate containing an ion-implanted getter region beneath and spaced from said surface;

wherein said implanted ion is carbon implanted through a silicon dioxide layer formed on said surface, said surface re-crystallized by annealing after removal of the silicon dioxide layer; and a solid state imaging device formed on the recrystallized surface.

2. A combination of a semiconductor wafer and a solid state imaging device according to claim 1, wherein said carbon in said getter region has a peak concentration of $1\times10^{16}$ atoms/cm$^3$ or more.

3. A combination of a semiconductor wafer and a solid state imaging device according to claim 1, wherein said carbon in said getter region is implanted at a dose of $5\times10^{13}$ to $5\times10^{15}$ ions/cm$^2$.

4. A combination of a semiconductor wafer and a solid state imaging device according to claim 1, wherein said semiconductor substrate contains oxygen at a concentration of its solubility limit or more.

5. A combination of a semiconductor wafer and a solid state imaging device according to claim 1, wherein said oxygen concentration is controlled to $8\times10^{17}$ atoms/cm$^3$ or more.

6. A combination of a semiconductor wafer and a solid state imaging device according to claim 1, wherein said carbon is implanted through said surface for forming electronic devices at an acceleration energy of about 200 keV to about 800 keV.

7. A combination of a semiconductor wafer and a solid state imaging device according to claim 1, wherein said carbon is implanted through said surface for forming electronic devices at an acceleration energy of about 800 keV and a dose of about $1\times10^{14}$ ions/cm$^2$.

8. A combination of a semiconductor wafer and a solid state imaging device according to claim 1, wherein said silicon is formed by the Czochralski (CZ) method with a resistivity of about 1 to 10 ohms-cm and an oxygen concentration of about $1.5\times10^{18}$ atoms/cm$^3$.

9. A silicon-containing wafer having a surface for growing an epitaxial layer thereon, said wafer comprising:

a silicon substrate having an initial oxygen concentration of at least $8\times10^{17}$ atoms/cm$^3$;

a getter site region formed in said silicon substrate beneath and spaced from said surface for growing an epitaxial layer, said getter sites created by ion-implantation of ions selected from the Group IV elements of C, Ge, Sn, Pb and ion-implanted into said getter site region through a silicon dioxide layer formed on said surface for growing an epitaxial layer, the silicon dioxide layer of sufficient thickness to avoid sputtering onto said surface for growing an epitaxial layer by the ion-implantation, said surface for growing an epitaxial layer re-crystallized subsequent to ion-implantation by annealing after removal of the silicon dioxide layer.

10. The silicon-containing wafer of claim 9, wherein said silicon substrate is formed by the Czochralski (CZ) method with a crystal growth rate of 1.0 mm/min or less.

11. The silicon-containing wafer of claim 9, wherein said initial oxygen concentration is $8\times10^{17}$ atoms/cm$^3$ and said silicon substrate has an initial resistivity of about 1 to 10 ohms-cm.

12. The silicon-containing wafer of claim 9, wherein said implanted ion is carbon implanted at a dose of between about $5\times10^{13}$ ions/cm$^2$ and about $5\times10^{15}$ ions/cm$^2$.

13. The silicon-containing wafer of claim 9, wherein said implanted ion is carbon implanted at a dose of about $1\times10^{14}$ ions/cm$^2$.

14. The silicon-containing wafer of claim 12, wherein said implanted ions are implanted at an acceleration energy between about 200 keV and 800 keV.

15. The silicon-containing wafer of claim 11, wherein said carbon-implanted getter region has a peak concentration of about $1\times10^{16}$ atoms/cm$^3$ at a position spaced from and beneath said surface for growing an epitaxial layer.

16. The silicon-containing wafer of claim 9, further comprising at least one electronic device epitaxially formed on the surface for growing an epitaxial layer.

17. The silicon-containing wafer of claim 16, further comprising a charged-coupled imaging device epitaxially formed on the surface for growing an epitaxial layer.

* * * * *